United States Patent
Reithmaier et al.

(10) Patent No.: US 7,570,681 B2
(45) Date of Patent: Aug. 4, 2009

(54) MULTISECTIONAL LASER

(75) Inventors: Johann Peter Reithmaier, Schauenburg (DE); Lars Bach, Ullersdorf (DE); Wolfgang Kaiser, Burgebrach (DE)

(73) Assignee: Nanoplus Nanosystems and Technologies GmbH, Gerbrunn (DE)

( * ) Notice: Subject to any disclaimer, the term of this patent is extended or adjusted under 35 U.S.C. 154(b) by 0 days.

(21) Appl. No.: 10/554,571

(22) PCT Filed: Apr. 29, 2004

(86) PCT No.: PCT/EP2004/004555

§ 371 (c)(1),
(2), (4) Date: Nov. 20, 2006

(87) PCT Pub. No.: WO2004/098005

PCT Pub. Date: Nov. 11, 2004

(65) Prior Publication Data

US 2007/0110114 A1 May 17, 2007

(30) Foreign Application Priority Data

Apr. 30, 2003 (DE) .............................. 103 19 817

(51) Int. Cl.
*H01S 5/00* (2006.01)

(52) U.S. Cl. ................. 372/50.1; 372/43.01; 372/50.11
(58) Field of Classification Search .............. 372/43.01, 372/50.1
See application file for complete search history.

(56) References Cited

U.S. PATENT DOCUMENTS 5,614,436 A * 3/1997 Shim et al. ..................... 438/32
6,687,278 B1 * 2/2004 Mason et al. ............. 372/50.22

* cited by examiner

*Primary Examiner*—Dung T Nguyen
(74) *Attorney, Agent, or Firm*—Michaelson & Associates; Peter L. Michaelson; George Wolken, Jr.

(57) ABSTRACT

Disclosed is a semiconductor laser (10) in which the substrate (11) comprises at least three independent functional sections (17, 20, 23) in the direction of light wave propagation (A), said functional sections (17, 20, 23) serving different functions and being individually triggered by means of electrodes (15, 18, 21) via electrode leads (16, 19, 22). An intensification zone (17), a grid zone (20), and a phase adjustment zone (23) are provided as functional sections. The light wave is optically intensified in the intensification zone (17) while the phase of the advancing and returning wave is adjusted in the phase adjustment zone (23). The grid zone (20) is used for selecting the wavelength and adjusting the intensity of coupling between the intensification zone (17) and the phase adjustment zone (23).

6 Claims, 3 Drawing Sheets

MULTISECTIONAL LASER

Figures 1, 2:
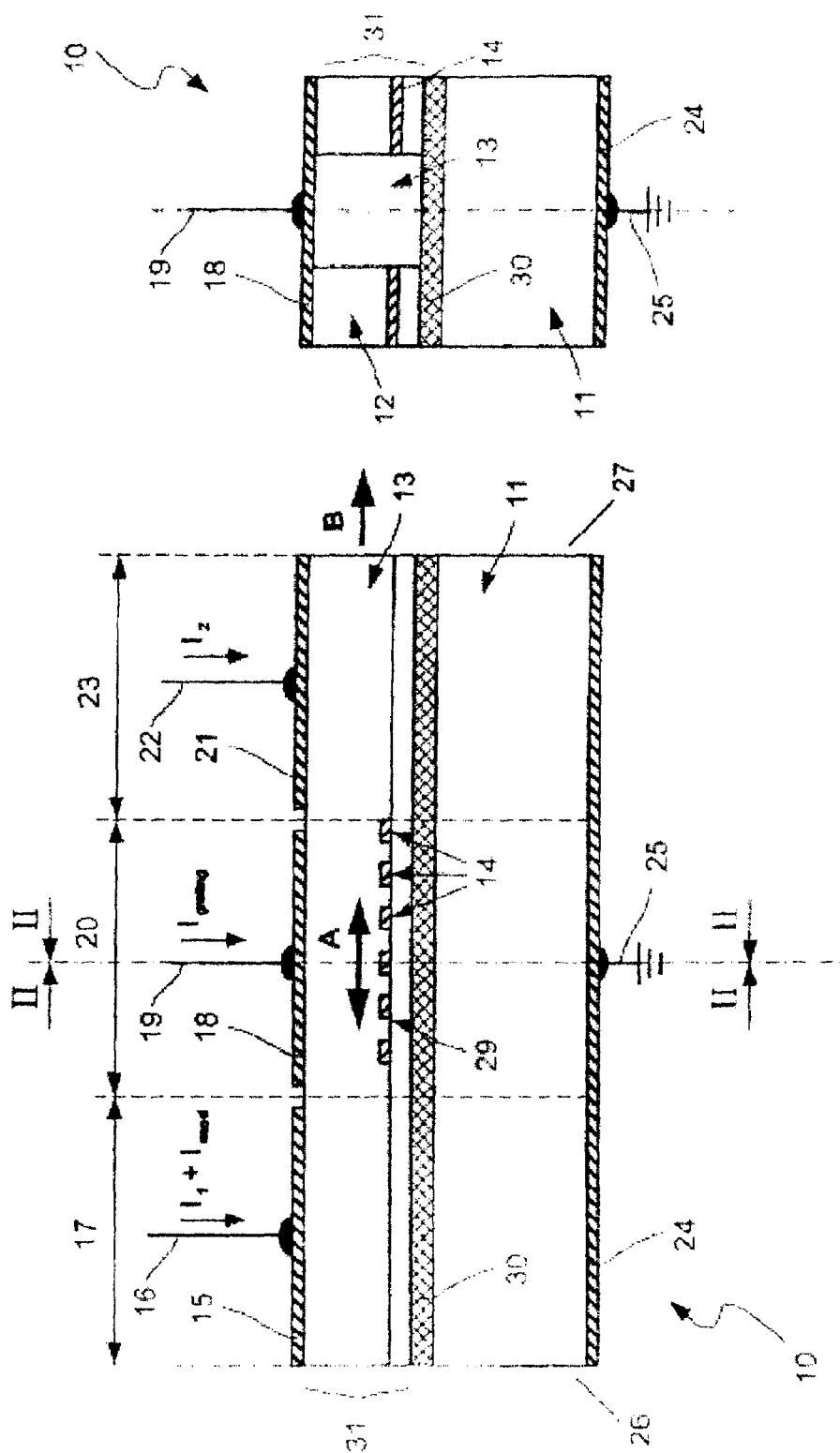

The invention pertains to a semiconductor laser with high modulation bandwidth. The invention also pertains to a method for operating a semiconductor laser.

Nowadays, semiconductor lasers are used in various technical fields.

One of these fields is communication engineering. In this case, information such as speech, moving images and still images or computer data is initially converted into electric signals if it is not already present in this form. The electric signals are subsequently used for modulating the brightness of a light source. The thusly obtained light signals can then be transmitted, for example, to a receiver via optical fibers. The receiver converts the received signals into electric signals. If so required, the thusly obtained electric signals are converted further.

If the transmission takes place over longer distances, it may be necessary to install intermediate amplifiers. According to the current state of the art, typical amplifiers of this type initially convert the light signals into electric signals that are then amplified and subsequently emitted anew by a modulated light source.

However, the described method for transmitting data in the form of light signals is not only utilized for transmitting data over longer distances. In the meantime, this type of data transmission is also used in local computer networks (LAN—Local Area Network), last but not least due to the high attainable transmission rates.

In order to achieve the highest data throughput possible on a transmission link, it is certainly advantageous if the light sources capable of modulation used for this purpose have the broadest modulation bandwidth possible. It should also be understood that the term light not only refers to the visible spectrum, but also, in particular, to the infrared range.

Due to their properties, semiconductor lasers are quite suitable for use as light sources capable of modulation in communication engineering. For example, semiconductor lasers have a small structural size, can be manufactured in a relatively cost-efficient fashion and are largely insensitive to environmental influences (particularly to shocks).

However, the modulation bandwidth of semiconductor lasers still poses a problem. For example, conventional semiconductor lasers have a maximum modulation bandwidth on the order of only 10 GHz and therefore the maximum transmission rate on the order of 10 GBit/s.

The aforementioned transmission rates result from the intrinsic high-frequency properties of semiconductor lasers that are essentially defined by the material properties and the layer structure properties, as well as operating parameters such as, for example, the injection current.

One significant limitation of the modulation bandwidth of a semiconductor laser is the recombination time of the charge carriers in the active layer. This recombination time depends on the material properties and the intensity of the interaction between the electron-hole junction and the electromagnetic radiation field in the laser cavity. The corresponding time constant indicates how fast the decoupled light output reacts to changes in the induced charge carrier density, i.e., the modulation current. Since the recombination time of the charge carriers is primarily dependent on the materials in the active layer, the maximum modulation bandwidth can only be conditionally increased.

For example, some improvements with respect to the modulation bandwidth were achieved by respectively providing the laser facets of the semiconductor lasers with an anti-reflective or a highly reflective coating or, alternatively, by realizing the components very short. However, the latter shortens the life of the photons in the cavity. These measures also have the disadvantage that the threshold current density increases significantly, and that the output power is very limited. In order to prevent an excessive drop in the output power, it was attempted to increase the differential amplification (dg/dN, wherein g is the material amplification and N is the charge carrier density), for example, by significantly increasing the active volume with a stack of quantum film layers. The recombination time of the charge carriers can also be reduced, for example, with a p-doping of the active zone.

In any case, the described measures cause a significant increase in the threshold current density and a noticeable deterioration of the laser properties. Until now, the maximum values attained with the described measures in lasers with an emission wavelength on the order of 1.5 µm were approximately 33 GHz.

Due to the unfavorable marginal conditions, directly modulated semiconductor lasers therefore are currently utilized for transmission rates up to approximately 10 GBit/s only.

In order to achieve higher bit rates, it was already attempted to circumvent the problem of the limited intrinsic bandwidth of semiconductor lasers by utilizing external modulators. Bandwidths up to 40 GHz were already attained with this method. However, this technology is very complex (several hybrid optoelectronic components are required) and correspondingly cost-intensive.

Consequently, the invention is based on the objective of proposing a semiconductor laser, in which a high modulation bandwidth is achieved without significantly deteriorating the operating parameters, wherein said semiconductor laser can also be manufactured in a relatively simple and cost-efficient fashion.

This objective is attained with the semiconductor laser and the method for operating semiconductor lasers proposed in the independent claims.

Advantageous additional developments of the semiconductor laser and the method are defined in the respective dependent claims.

In order to obtain a semiconductor laser with high modulation bandwidth, the invention proposes that the semiconductor laser has a substrate that comprises at least three independent functional sections in the direction of light wave propagation. The functional sections are realized, in particular, in the form of an amplification zone (occupation number inversion by means of pumping), a grating zone and a phase adaptation zone. In this context, it should be noted that the term light waves not only refers to light with wavelengths in the visible spectrum, but also, in particular, to infrared waves.

The independent sections respectively fulfill different functions and make it possible to optimally adjust the individual tasks, namely without the optimal adjustment of one task negatively influencing the adaptation of another task. This means that the individual adaptations of the tasks can be respectively solved in an optimal fashion, wherein it is possible, in particular, to adapt the individual tasks in such away that a largely optimal synergetic effect is achieved. A corresponding adjustment of a grating zone or a coupling zone also makes it possible, in particular, to couple the remaining sections to one another in an optimal fashion with respect to the bandwidth of the semiconductor laser such that a largely optimal coupling between the electron-photon resonance (interaction between the electron-hole junction and the electromagnetic radiation field in the laser cavity) and the photon-photon resonance (constructive superposition of the forward and the backward wave in the resonator) can be achieved. Due to this new design concept, the attenuation of the electron-photon resonance can be significantly reduced, and the bandwidth of the semiconductor laser (−3 dB bandwidth) can be shifted to significantly higher values.

Despite the particularly high modulation bandwidth that can be achieved with the proposed semiconductor laser, the inventive laser does not necessarily exhibit the negative effects that were previously associated with an increase in the modulation bandwidth, for example, an increase in the threshold current density and a reduction of the output power.

In the aforementioned design concept, it would also be conceivable for one functional section to fulfill two functions. For example, the grating zone that serves for the wavelength selection may simultaneously serve, in particular, as a coupling element between the amplification zone and the phase adaptation zone.

A particularly simple manufacturing process is achieved if the substrate of the semiconductor laser is realized in the form of a monolith. In addition, undesirable reflections or phase shifts usually do not occur at the junctions between different substrate regions. Corresponding impedance adaptation junctions may have to be provided, if so required.

It is advantageous that the semiconductor laser is provided with at least one waveguide region. This makes it possible to achieve a defined propagation of the light wave in the semiconductor substrate. If so required, different regions of the waveguide may have different wavelength dispersions (also with respect to the sign) such that wave packets exhibit the least dispersion possible over the total length of the semiconductor laser.

If the individual functional sections essentially fulfill only one function, the adaptation of these functions can be additionally improved.

An advantageous coupling between the amplification zone and the phase adaptation zone can be promoted if a grating zone, a coupling zone or both (if applicable, in the form of a combined grating and coupling zone) is arranged between the amplification zone and the phase adaptation zone. This usually results in a particularly high modulation bandwidth.

It is particularly advantageous if only a weak coupling between the light wave A and the grating structure results in the grating zone. The invention proposes, in particular, a coupling coefficient κ of $\kappa \leq 60$ cm$^{-1}$, preferably between $\kappa=10$ cm$^{-1}$ and $\kappa=50$ cm$^{-1}$, particularly between $\kappa=20$ cm$^{-1}$ and $\kappa=40$ cm$^{-1}$. Since the coupling is comparatively weak, the transmittance of the light wave through the grating zone is ensured. This is particularly important if the grating zone is arranged between the amplification zone and the phase adaptation zone as described above. In addition, the weak coupling makes it possible to easily choose the filter curve of the grating zone in a sufficiently, but not excessively selective fashion by providing a corresponding number of grating structure elements.

In case of an active grating zone, an active coupling zone or both, i.e., if the coupling between the light wave and the grating structure as well as the attenuation and the coupling properties (coupling through the section in question) of the respective zones can be varied, it is possible to additionally promote a mutually optimal adaptation of the individual functional sections. When carrying out an adaptation of an active zone, it may occur that the change of one property (e.g., the coupling between the light wave and the grating structure) results in a change of another property (e.g., the attenuation of the light wave while it passes through the grating).

It also proved advantageous to design the grating structures in such a way that they are realized laterally referred to the waveguide region. This measure makes it possible, in particular, to achieve the described weak coupling between the light wave and the grating in a particularly simple fashion.

It is also advantageous that the semiconductor laser has a component length that corresponds to that of conventional semiconductor lasers, namely a component length of more than 0.5 mm, preferably more than 0.8 mm, particularly more than 1.0 mm. This measure makes it possible to eliminate the need for an excessively high differential current amplification that could lead to correspondingly disadvantageous operating parameters. Excessive injection current intensities and a limited laser output power, in particular, can be prevented in this fashion.

The invention also proposes a corresponding method for operating a semiconductor laser that makes it possible to achieve a particularly high modulation bandwidth. In this context, the invention proposes that different tasks such as, in particular, amplification (occupation number inversion by means of pumping), phase adaptation, wavelength selection and/or attenuation are carried out in at least three independent sections along the substrate material of the semiconductor laser. This method provides the same advantages as those described above with reference to the proposed semiconductor laser.

The proposed method can be additionally developed in a particularly advantageous fashion if the individual sections are adapted such that a largely optimal coupling between the electron-photon resonance and the photon-photon resonance of the semiconductor laser is achieved. This additionally promotes a particularly high modulation bandwidth of the semiconductor laser.

It is also advantageous that the semiconductor laser is operated on the side of longer wavelength of the reflection peak. This measure makes it possible, in particular, to easily prevent a chirp (i.e., a frequency modulation of the semiconductor laser that results from a changed amplitude), namely because the modulation of the optical index of refraction is normally at its lowest in this case. Since a frequency chirp results in a temporal superposition of the pulses after a certain transmission distance due to the dispersion of a following optical fiber, an additionally improved transmission rate can be realized with the proposed additional development.

One preferred embodiment of the invention is described in greater detail below with reference to the figures.

Figure 3:
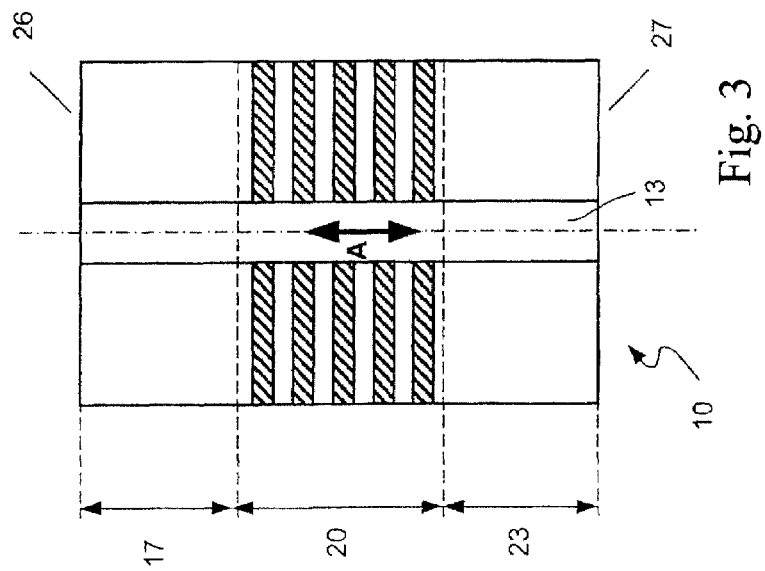
Figure 4:
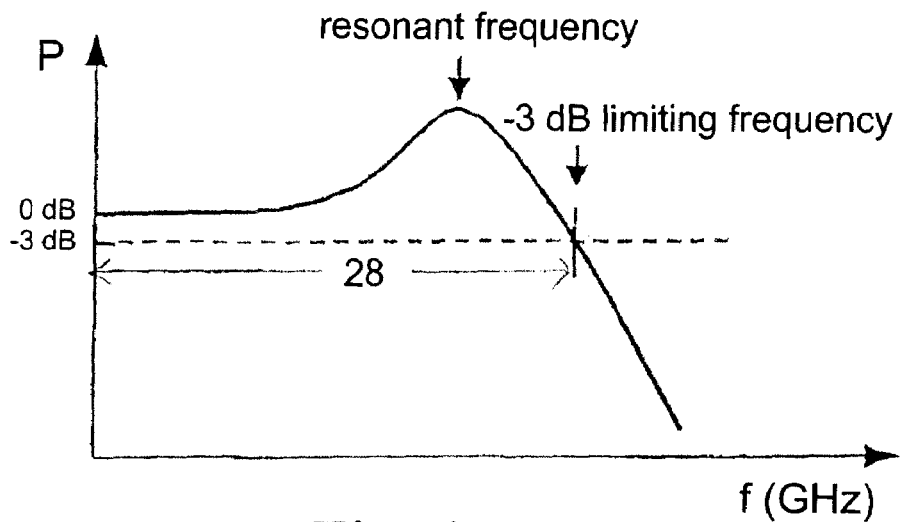
Figure 5:
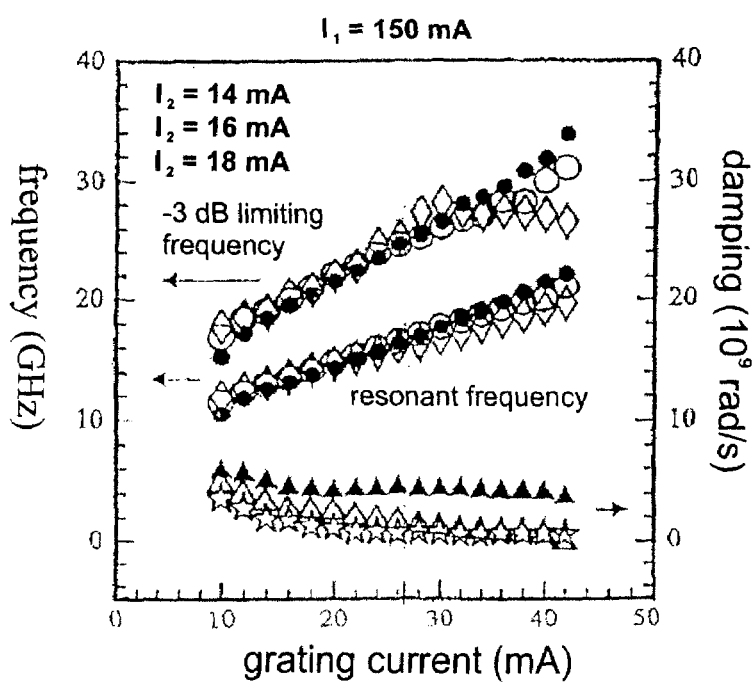

The figures show:

FIG. 1, a side view of one proposed design of the semiconductor laser with 3 sections;

FIG. 2, a cross section through the semiconductor laser shown in FIG. 1 along the axis II-II;

FIG. 3, the grating structure of the semiconductor laser shown in FIG. 1 in the form of a schematic top view;

FIG. 4, a typical power characteristic of a semiconductor laser as a function of the modulation frequency, and FIG. 5, typical measuring results for a prototype of the proposed semiconductor laser with 3 sections.

FIG. 1 shows one possible design of the proposed semiconductor laser diode 10, wherein the semiconductor laser diode 10 has a high modulation bandwidth 28. The structure of the proposed principle represents that of a so-called CCIG laser (for "coupled cavity injection grating").

The basic structure of the semiconductor laser diode 10 shown usually consists of a doped multi-layer system on a substrate material 11 and a contradoped multi-layer system that serves as the cover layer 31. A charge carrier recombination zone of one or more layers 30 is embedded in the region of the contradoping junction and serves for the optical amplification of the semiconductor laser diode 10. These layers may consist of bulk semiconductor material, quantum film structures, quantum wire structures or quantum dot structures. The semiconductor materials usually consist of III/V and II/VI semiconductor materials, for example, gallium arsenide (GaAs), indium phosphide (InP) or more complex compound semiconductors, such as, for example, GaInAsP, GaInAs or AlGaAs. Beryllium (Be), carbon (C) or silicone (Si) are frequently used as dopants.

The described component comprises a strip waveguide 13 that is laterally surrounded by an inorganic or organic insulating material 12. Polymers or dielectric materials with a low relative permittivity are normally utilized for maintaining the contact capacities at a low level. The broken line shown in FIG. 1 symbolizes the longitudinal direction of the waveguide region 13.

Laser facets 26 and 27 arranged on both end faces of the semiconductor laser diode 10 are conventionally coated with a reflecting layer or partially coated with such a layer, respectively. Consequently, a laser cavity is formed between the two laser facets 26 and 27. In the embodiment shown, the first laser facet 26 is fully coated with a reflecting layer while the second laser facet 27 is only partially coated with a reflecting layer such that optical energy, particularly light, is decoupled in the direction of the arrow B at the second laser facet 27.

The embodiment of the semiconductor laser diode 10 shown in the figures also contains a waveguide region 13, along which the electromagnetic wave extends in the laser cavity. This is indicated by the double arrow A.

According to the invention, the example of the semiconductor laser diode 10 shown in the figures is divided into three sections 17, 20, 23. A separate electrode 15, 18, 21 with its own lead 16, 19, 22 is respectively provided in each section and electrically insulated from the other electrodes. A single, flatly applied ground electrode 24 with a ground wire 25 assigned thereto is situated on the opposite side of the electrodes 15, 18, 21. Naturally, it would also be possible to divide the ground electrode 24 into two or more partial regions. In addition, the ground electrode 24 can also be set to another suitable potential.

In the semiconductor laser diode 10 shown, the different sections 17, 20, 23 respectively fulfill different functions.

For example, the first section 17 serves as an amplification and modulation zone 17. The injection current $I_1$ and the modulation current $I_{mod}$ are fed to the first electrode 15 via the first lead 16. The injection current $I_1$ causes the occupation number inversion (pumping of the occupation states). In this case, $I_1$ is a direct current that is chosen in such a way that it can be varied in both directions without interrupting the laser radiation. This means that the intensity of the laser radiation can be adjusted accordingly. The modulation current $I_{mod}$ serves for varying the laser output power P. $I_{mod}$ is chosen in accordance with the communication signal to be transmitted and may be realized, for example, digitally in the form of pulses of different length or in an analog fashion, namely in the form of an analog signal with different amplitude. The total current $I_1 + I_{mod}$ fed to the first electrode 15 therefore usually consists of a direct current with a superimposed alternating component.

If present in the form of digital signals, in particular, $I_1$ naturally may also be chosen slightly below the laser threshold such that $I_{mod}$ brings the semiconductor laser diode 10 over the laser threshold in accordance with its clocking.

The second section 20 serves as the grating zone 20, wherein the grating 29 in the embodiment shown is realized in the form of an active grating 29. A second electrode 18 with a corresponding lead 19 is provided in the region of the grating zone 20 in order to control the grating 29.

The grating 29 serves for selecting the wavelength of the semiconductor laser diode 10 and is realized in the form of a so-called DBR grating (for "distributed bragg reflector") in the embodiment shown, wherein the individual grating structure elements 14 are realized in the form of lateral grating structure elements 14 referred to the waveguide region 13 (see also FIG. 2 and FIG. 3). This design has the advantage that the coupling between the light wave and the grating 29 is relatively weak such that a plurality of grating structure elements 14 contribute to the interference and the optical radiation can still be transmitted through the grating 29. In the embodiment shown, the grating 29 can therefore be realized in the center between the amplification zone 17 and the phase adaptation zone 23 (third section). The grating structure elements 14 can be realized arbitrarily, for example, by means of material application, material removal or doping. In the embodiment shown, the grating structure is impressed with the aid of a focused ion beam. The coupling intensity κ should lie around, $κ ≦ 60$ cm$^{-1}$, preferably between $κ = 10$ cm$^{-1}$ and $κ = 50$ cm$^{-1}$, particularly between $κ = 20$ cm$^{-1}$ and $κ = 40$ cm$^{-1}$. In any case, the minimum coupling intensity κ should amount to a few cm$^{-1}$.

The grating current $I_{Gitter}$ fed to the grating zone 20 via the second electrode 18 makes it possible to vary the attenuation properties of the grating zone 20 such that the grating zone 20 can serve as an adaptable coupling element between the amplification zone 17 and the phase adaptation zone 23. The coupling between these two sections and therefore the coupling intensity between the electron-photon resonance and the photon-photon resonance can be optimally adapted in this fashion.

The third section 23 serves as a phase adaptation zone 23. For this purpose, a phase adaptation current $I_2$ can be fed to the phase adaptation zone 23 of the semiconductor laser diode 10 via the third lead 22 and the third electrode 21. The current $I_2$ makes it possible to raise or lower the optical density in the third section 23 by increasing or decreasing the free charge carriers and therefore to respectively lengthen or shorten the geometric length of the cavity for the light wave. This allows an optimal adaptation of the phase position for the photon-photon resonance.

If the phase is optimally adjusted, the emission wavelength lies on the side of longer wavelength of the reflection peak. This method for adjusting the emission wavelength to the side of longer wavelength of the grating reflection peak is also referred to as "detuned loading." The electron-photon resonance is then coupled with the faster photon-photon resonance.

According to the invention, three sections 17, 20, 23 are provided that respectively fulfill different adaptation tasks. This makes it possible to carry out the individual adaptations (in this case, pumping/amplification, attenuation/wavelength selection and phase adaptation) independently of the other adaptation tasks and therefore to achieve a mutually optimal adaptation. This would only be possible to a limited degree in a two-section design—or even in a single-section design—because the phase position cannot be adjusted separately of the coupling, attenuation and pumping properties. The optimal adaptation of the individual parameters makes it possible, however, to optimally utilize the photon-photon resonance, as well as to optimally adjust the coupling intensity between the electron-photon resonance and the photon-photon resonance.

Naturally, diverse variations of the semiconductor laser diode 10 shown can be realized. For example, it would be possible to provide larger passive regions (without electrodes) between the sections 17, 20, 23. It would also be conceivable to provide an additional attenuation or coupling region.

FIGS. 2 and 3 show different views of the semiconductor laser diode 10 according to FIG. 1. These figures are intended to elucidate, in particular, the lateral design of the grating structure elements 14.

FIG. 4 schematically shows the typical output power P of a semiconductor laser with small-signal modulation, namely as a function of the frequency f of the modulation signal. The maximum modulation frequency is essentially defined by the recombination time of the charge carriers in the active layer. This recombination time depends on the material properties and the intensity of the interaction between the electron-hole junction and the electromagnetic radiation field in the laser cavity. The corresponding resonant frequency is referred to as the electron-photon resonance and indicates the time constant, with which the decoupled light reacts to changes in the induced charge carrier density, i.e., the modulation current $I_{mod}$. The amplitude of the natural frequency is attenuated due to electronic and optical losses. The output power P drops significantly above the resonant frequency $f_{res}$.

The modulation bandwidth is defined as the maximum frequency, at which the amplitude of the modulated light output power P drops to half the value of the continuous wave mode ("continuous wave") (−3 dB limiting frequency).

In addition to the electron-photon resonance, a so-called photon-photon resonance is also created in optical cavities due to the constructive superposition of the forward wave and the backward wave in the resonator. This photon-photon resonance essentially is only dependent on the speed of a photon in the laser cavity, i.e., it is usually not dependent on the operating parameters, and can be adjusted by choosing the length of the component accordingly. The typical speed (or round trip) frequency for a laser with a length of 1 mm lies at approximately 44 GHz. However, a residual dependence remains, for example, because the resonant frequency is slightly dependent on the injection current. However, this does not change the magnitude of the resonant frequency. This effect typically lies in the per thousand range and makes it possible, for example, to adjust the phase position.

FIG. 5 shows measurements for a prototype of the described semiconductor laser diode 10. The semiconductor laser diode 10 was based on indium phosphide (InP) and had a length of 1.1 mm. The semiconductor laser diode 10 was operated at room temperature with an injection current I1=150 mA and a modulation current amplitude $I_{mod}$=12.5 mA. The emission wavelength amounted to 1.5 μm.

FIG. 5 respectively shows the −3 dB limiting frequency, the resonant frequency $f_{res}$ and the attenuation in dependence on the grating current $I_{Gitter}$. In this case, three different phase adaptation currents $I_2$ were respectively used, namely $I_2$=14 mA, $I_2$=16 mA and $I_2$=18 mA.

Generally speaking, the resonant frequency and the bandwidth (−3 dB limiting frequency) of the semiconductor laser diode 10 continuously increase as the intensity of the grating current $I_{Gitter}$ increases, namely for all phase adaptation currents $I_2$ shown. An improved phase adaptation was achieved in this case by lowering the adaptation current $I_2$. This improvement in the phase adaptation already caused an increase in the resonant frequency of approximately 10%. The attenuation was simultaneously reduced by increasing the two currents $I_2$ and $I_{Gitter}$. In the tested prototype, the −3 dB bandwidth can be estimated at approximately 34 GHz. This represents an improvement by a factor of approximately 4 in comparison with a conventional laser that has approximately the same length and the same layer properties.

It should be mentioned that the measuring setup used was only able to resolve a limited bandwidth, and that values of the −3 dB limiting frequency above 20 GHz could only be determined with the aid of adaptation curves. The apparent saturation of the bandwidth for a phase adaptation current $I_2$=18 mA is an artifact that can be traced back to problems with the adaptation.

The most recent measurements carried out on comparable multisectional lasers with a measuring setup of greater bandwidth (40 GHz bandwidth) showed an actual modulation bandwidth of 37 GHz for an InP-based semiconductor laser with a length of 1.5 mm. This value is approximately 4.5-times higher than the value for a comparable strip waveguide laser according to state of the art and represents a record for InP-based lasers.

The invention claimed is:

1. A semiconductor laser comprising:
   a substrate wherein said substrate includes at least three independent functional sections located in the path of propagation of the light wave produced by said semiconductor laser, and wherein said at least three independent functional sections include at least one amplification zone, at least one grating zone and at least one phase adaptation zone, and wherein said at least one amplification zone and said at least one phase adaptation zone contain no grating structure elements; and,
   wherein said grating zone has a coupling coefficient not greater than about 60 cm$^{-1}$.

2. A semiconductor laser as in claim 1 wherein said coupling coefficient is in the range from about 10 cm$^{-1}$ to about 50 cm$^{-1}$.

3. A semiconductor laser as in claim 1 wherein said coupling coefficient is in the range from about 20 cm$^{-1}$ to about 40 cm$^{-1}$.

4. A semiconductor laser comprising:
   a substrate wherein said substrate includes at least three independent functional sections located in the path of propagation of the light wave produced by said semiconductor laser, and wherein said at least three independent functional sections include an amplification zone, a grating zone and a phase adaptation zone, and wherein said amplification zone and said phase adaptation zone contain no grating structure elements; and,
   wherein said grating zone has a coupling coefficient not greater than about 60 cm$^{-1}$.

5. A semiconductor laser as in claim 4 wherein said coupling coefficient is in the range from about 10 cm$^{-1}$ to about 50 cm$^{-1}$.

6. A semiconductor laser as in claim 4 wherein said coupling coefficient is in the range from about 20 cm$^{-1}$ to about 40 cm$^{-1}$.

* * * * *